(12) United States Patent
Travis (10) Patent No.: US 6,486,550 B1
(45) Date of Patent: Nov. 26, 2002

(54) LOCKING MECHANISM FOR DETACHABLY SECURING A WAFER CARRIER TO A CONVEYOR

(75) Inventor: Glenn W. Travis, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 2 days.

(21) Appl. No.: 09/606,071

(22) Filed: Jun. 29, 2000

(51) Int. Cl.$^7$ ............................................... H01L 23/34
(52) U.S. Cl. ........................................ 257/726; 438/716
(58) Field of Search ............................... 257/726, 685, 257/727; 438/716

(56) References Cited

U.S. PATENT DOCUMENTS

| | | | | |
|---|---|---|---|---|
| 5,643,064 A | * | 7/1997 | Grinderslev et al. | ......... 451/378 |
| 6,143,147 A | * | 11/2000 | Jelinek | ................... 204/298.15 |
| 6,186,880 B1 | * | 2/2001 | Gonzalez et al. | ........... 451/397 |
| 6,309,290 B1 | * | 10/2001 | Wang et al. | ................. 451/398 |

FOREIGN PATENT DOCUMENTS

EP 0916452 5/1999

* cited by examiner

Primary Examiner—David Nelms
Assistant Examiner—Quoc Hoang
(74) Attorney, Agent, or Firm—Brinks Hofer Gilson & Lione (57) ABSTRACT

A system and method for detachably securing a locking mechanism to a housing is provided. The locking mechanism comprises a cam ring, a retention ring and a plurality of locking elements. The cam ring and the retention ring are slidably coupled and concentric with respect to each other. The locking elements are movably disposed within the cam ring and the retention ring. When a rotational force is applied to the locking mechanism, the locking elements move between a first position and a second position. The housing is positioned adjacent the locking elements and concentric with the locking mechanism. In the second position, the locking elements engage an engagement mechanism on the housing.

28 Claims, 5 Drawing Sheets

LOCKING MECHANISM FOR DETACHABLY SECURING A WAFER CARRIER TO A CONVEYOR

FIELD OF THE INVENTION

The present invention relates to planarization of semiconductor wafers using a chemical mechanical planarization technique. More particularly, the present invention relates to an improved system and method for detachably coupling a wafer carrier to a conveyor during the chemical mechanical planarization process.

BACKGROUND

Semiconductor wafers are typically fabricated with multiple copies of a desired integrated circuit design that will later be separated and made into individual chips. Wafers are commonly constructed in layers, where a portion of a circuit is created on a first level and conductive vias are made to connect up to the next level of the circuit. After each layer of the circuit is etched on the wafer, an oxide layer is put down allowing the vias to pass through but covering the rest of the previous circuit level. Each layer of the circuit can create or add unevenness to the wafer that must be smoothed out before generating the next circuit layer.

Chemical mechanical planarization (CMP) systems are used to planarize the raw wafer and each layer of material added thereafter. Available CMP systems, commonly called wafer polishers, are typically an automated or semi-automated process involving multiple processing steps. The processing steps generally include transporting, aligning, polishing, washing and drying the wafers. In general, the wafers are received by the CMP system, processed and returned to a predetermined location, in a clean, dry, and uniformly planarized condition by the CMP system.

The processing step of polishing to achieve a uniformly planarized wafer can be performed sequentially at a number of processing stations having different degrees of material removal capability. The CMP systems often use a wafer carrier to hold the wafer during polishing. The wafer carrier is typically transported in a conveyor to the processing station(s). At the processing station(s), the wafer carrier is removed from the conveyor and the wafer thereon is brought into contact with a polishing pad rotating in the plane of the wafer surface to be planarized. Following the polishing and planarization operation, the wafer carrier is lifted off of the polishing pad and transferred back to the conveyor. The wafer carrier is coupled and uncoupled with the conveyor multiple times, especially when polishing occurs at multiple processing stations.

Some prior art systems for coupling wafer carriers to conveyors include multiple manipulative actions of the wafer carrier and/or the conveyor. Multiple steps result in a longer period of time required to couple and uncouple the wafer carrier and therefore the possibility of reduction in throughput of the CMP system. Further, multiple manipulations typically require multiple actuators or similar devices which present more maintenance and potential failure points in the CMP system. In addition, some prior art systems use actuators to maintain the coupling of the wafer carrier and the conveyor. In a loss of power and/or pneumatic air supply situation, the wafer carrier could be inadvertently detached from the carrier. Some prior art coupling systems also implement pins or other similar features that require precise alignment and may be bent or broken due to thrust loading that occurs when the wafer carrier is inserted and removed from the conveyor.

Accordingly, there is a need for systems and methods of detachably coupling the wafer carrier to the conveyor that involve few manipulative steps, allow for positive locking, and are rugged and easily alignable.

SUMMARY

A system and method for detachably securing a locking mechanism to a housing is provided. In one preferred embodiment, the locking mechanism is fixedly coupled to a conveyor and is capable of being detachably coupled with a housing, such as, a wafer carrier. Manipulation of the wafer carrier with respect to the locking mechanism involves aligning an engagement mechanism on the wafer carrier to be adjacent the locking mechanism. Operating the locking mechanism to couple and uncouple the locking mechanism and the wafer carrier involves rotating the locking mechanism between two positions. The relatively few manipulative acts involved in coupling and uncoupling the wafer carrier to the conveyor create a fast and efficient coupling process that is easily alignable. In addition, the presently preferred locking mechanism does not include structural features that are easily bent or broken during the coupling and uncoupling of the wafer carrier to the conveyor. Further, the presently preferred locking mechanism provides positive locking action since it returns to, or maintains, a locked state when no actuators are acting upon it.

One presently preferred locking mechanism comprises a cam ring, a retention ring and a plurality of locking elements. The cam ring is slidably coupled to the retention ring and is concentric therewith. The cam ring includes a plurality of cam slots having an angular inner surface that are operatively positioned adjacent to a plurality of apertures in the retention ring. The locking elements are movably disposed within the cam slots adjacent the angular inner surface and are retained therein by the apertures.

The locking elements are movable between a first position defined as an unlocked position and a second position defined as a locked position. When the locking mechanism is rotated to an unlocked state, the locking elements are in the first position and a portion of the locking elements only protrude from the retention ring in a first direction. When the locking mechanism is rotated in the opposite direction to a locked state, the locking elements are in the second position and also protrude from the retention ring in an opposite direction. The housing includes an engagement mechanism that is adapted to engage the locking elements. When the locking elements are in the locked position, and the housing is positioned concentric with the retention ring and adjacent to the apertures therein, the locking elements engage the engagement mechanism.

Other features and advantages of the invention will be apparent from the drawings and the more detailed description of the invention that follows. The foregoing discussion of the presently preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
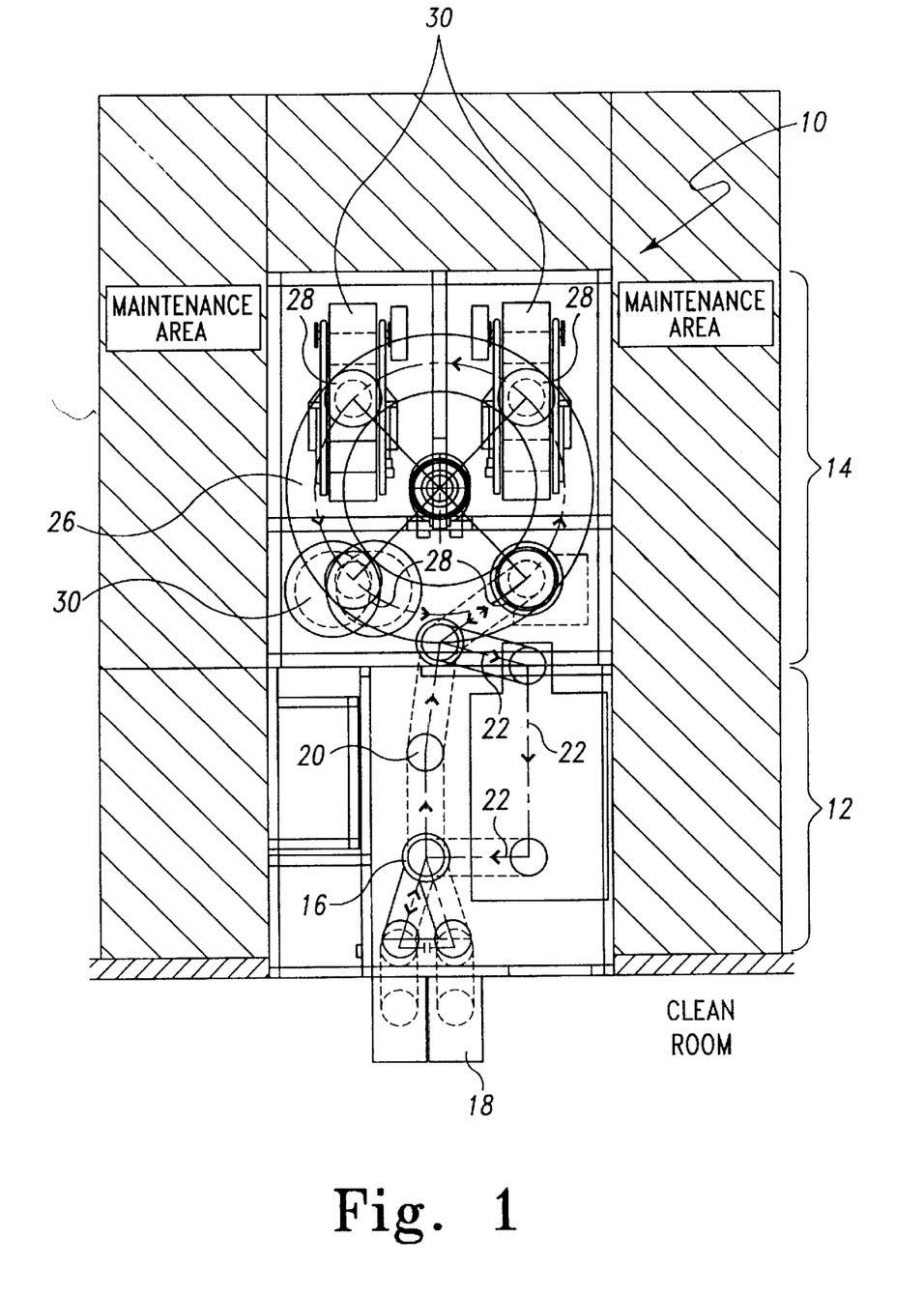
FIG. 1 is a plan view schematic of a semiconductor wafer polishing system according to a preferred embodiment of the present invention.

A presently preferred embodiment of a wafer polishing system 10 is generally illustrated in FIG. 1. One example of a wafer polishing system 10 is the TERES™ Chemical Mechanical Polishing (CMP) system available from Lam Research Inc. located in Fremont, Calif. FIG. 1 is a plan view of the wafer polishing system 10 that includes a front-end portion 12 connected to a back-end portion 14. The wafer polishing system 10, typically used in a semiconductor wafer fabrication facility, receives semiconductor wafers 16 at the front-end portion 12 from a wafer holder 18 that is adjacent to the front-end portion 12. The semiconductor wafers 16, hereinafter referred to as wafers 16, are circular shaped discs that are separable into individual chips containing integrated circuits. The wafer holder 18 is a rack or other similar structure capable of holding the wafers 16 in a uniform and organized fashion.

The front-end portion 12 retrieves the wafers 16 from the wafer holder 18 and transfers the wafers 16 to the back-end portion 14 as illustrated generally by arrow 20. The back-end portion 14 planarizes the wafers 16 and then returns the wafers 16 to the front-end portion 12 for final cleaning, rinsing and drying. In general, the wafers 16 are completely processed in the front and back end portions 12,14 and are then returned to a predetermined location, in a clean, dry, and uniformly planarized condition by the system 10. In the presently preferred embodiments, the wafers 16 are returned to the wafer holder 18 as illustrated by arrows 22.

The back-end portion 14 includes a conveyor 26, a plurality of wafer carriers 28 and a plurality of belt polishing modules (BPMs) 30. Individual wafers 16 that are transferred from the front-end portion 12 are received by the back-end portion 14 and loaded onto the conveyor 26. The wafers 16 are loaded on the conveyor 26 by attachment to the wafer carriers 28 that are coupled to the conveyor 26. The wafers 16 are then transported to the BPMs 30 by the conveyor 26. The presently preferred BPMs 30 are positioned such that the wafer carriers 28 can be detached from the conveyor 26 and lowered to the BPMs 30 during a polishing operation. The BPMs 30 can be, for example, linear or rotary wafer polishers that operate to remove material from the surface of the wafers 16. For a more detailed description of a suitable wafer polishing system 10 reference is made to the pending application entitled "Method and Apparatus for Polishing Semiconductor Wafers" Ser. No. 08/968,333 to Engdahl et. al, the entirety of which is herein incorporated by reference.

Figure 2:
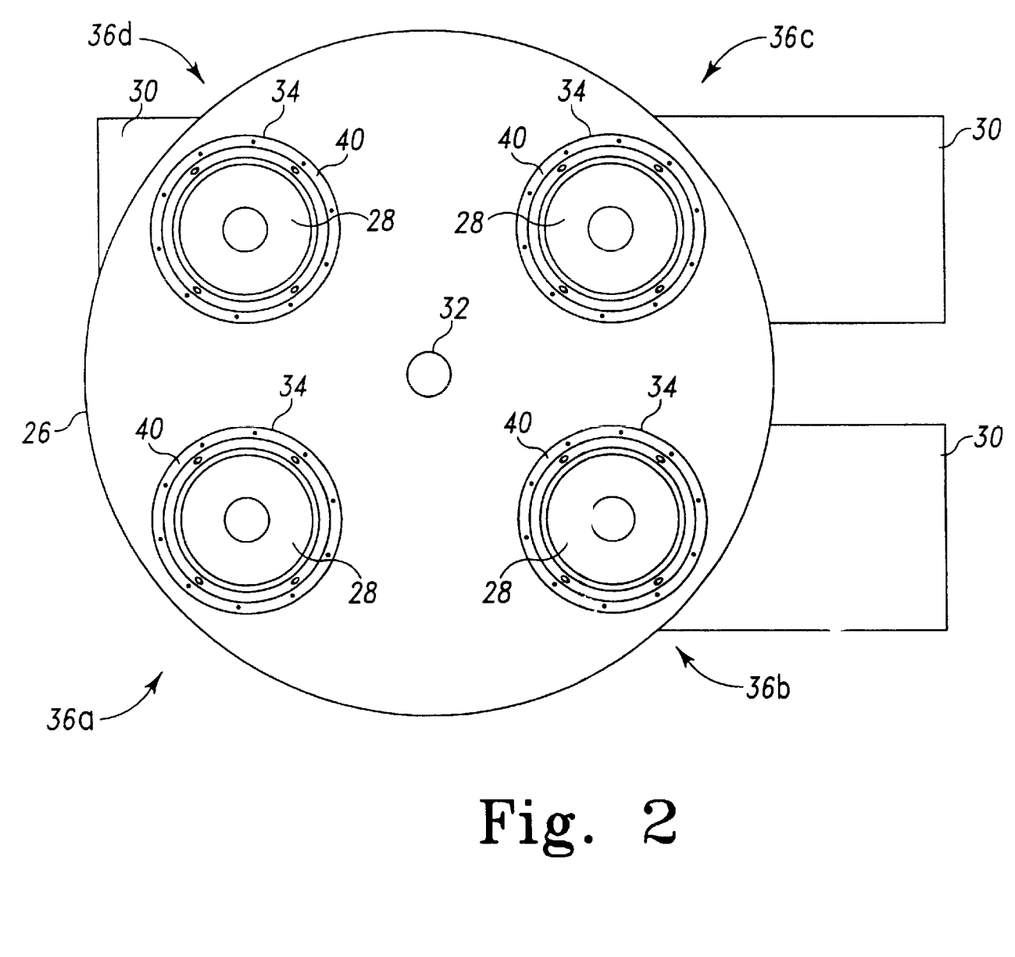
FIG. 2 is a plan view schematic of a portion of the semiconductor wafer polishing system of FIG. 1.

FIG. 2 generally illustrates a plan view of the presently preferred conveyor 26 and the BPMs 30 illustrated in FIG. 1. The conveyor 26 includes a central hub 32 and a plurality of wafer retainer locations 34. The conveyor 26 could be a longitudinally extending belt, a robotic arm or any other mechanism capable of conveying the wafers 16. The presently preferred conveyor 26 is a circular table that extends radially outward from the hub 32. The axially located hub 32 is rotatably connected to a motor (not shown) to rotate the conveyor 26. The conveyor 26 is rotatable to move the wafer retainer locations 34 between a plurality of processing areas 36 in which the wafer 16 is processed. In one presently preferred embodiment, the wafer polishing system 10 includes four processing areas 36; namely, a load/unload area 36a, a first polishing area 36b, a second polishing area 36c and a buff area 36d as illustrated. The conveyor 26 could, for example, have more wafer retainer locations 34 to accommodate additional processing areas 36.

Each of the wafer retainer locations 34 receives one of the wafer carriers 28. The wafer carriers 28 can be any housing capable of fixedly holding the wafers 16 that is removable from, and deliverable to, the conveyor 26. The wafer carrier 28 is removed from the conveyor 26, for processing within one of the processing areas 36, and is then returned to the conveyor 26 when that process is complete. In the presently preferred embodiments, the wafers 16 are fixedly positioned on a bottom face (not shown) of the wafer carriers 28. The wafers 16 are loaded onto the presently preferred conveyor 26 by being positioned on the wafer carrier 28 in the load/unload area 36a.

The wafer carriers 28 are received by the presently preferred conveyor 26 by being positioned in one of the wafer retainer locations 34. The wafer carriers 28 are raised or lowered into the wafer retainer locations 34 by an actuator, such as a spindle drive assembly, that removably attaches to the wafer carrier using, for example, a robotic tool changer. The surfaces of the wafer carriers 28 include an engagement mechanism to facilitate coupling with the conveyor 26. The engagement mechanism can be, for example, fingers, lugs, slots, raised portions, recesses or other similar structure to facilitate a secure engagement. The presently preferred wafer carrier 28 includes an annular groove 92 (see FIG. 4) on the outer surface that surrounds the wafer carrier 28.

The wafer carrier 28 is detachably secured to the conveyor 26 by a locking mechanism 40. The locking mechanism 40 is fixedly coupled to the conveyor 26 and formed to engage the wafer carrier 28. The locking mechanism 40 can be for example a plurality of fingers, uniformly spaced walls, a continuous ring or any other rigid structures capable of securing the wafer carriers 28. Dependent on the configuration of the conveyor 26 with respect to the wafer carrier 28, the locking mechanism 40 may engage an inner or an outer surface of the wafer carrier 28. The presently preferred locking mechanism 40 is operable to couple the wafer carrier 28 to the conveyor 26 when the wafer carrier 28 is operably positioned within one of the wafer retainer location 34. Accordingly, the wafer carrier 28 is positioned with the locking mechanism 40 concentrically surrounding the wafer carrier 28.

The locking mechanism 40 has a first position representing an unlocked state and a second position representing a locked state. The locking mechanism 40 is rotatably operable to move between the locked and unlocked states. When external forces are not acting to rotate the locking mechanism 40 to the unlocked state, it returns to, or maintains, the locked state as its resting position. In the locked state, the locking mechanism 40 engages the engagement mechanism on the wafer carrier 28 to couple the wafer carrier 28 to the conveyor 26.

During automated operation of the presently preferred wafer polishing system 10, the wafer carriers 28 are transferred between the processing areas 36 by the conveyor 26. The wafer carriers 28 are coupled with, and uncoupled from, the conveyor 26 within the processing areas 36 using the locking mechanism 40. During the coupling operation, the wafer carriers 28 are positioned such that the engagement mechanism thereon is adjacent the locking mechanism 40 and the wafer carrier 28 is concentric with the locking mechanism 40. Rotational operation of the locking mechanism 40 to its resting position secures the wafer carrier 28 to the conveyor 26. The wafer carrier 28 is detached from the conveyor 26 by rotating the locking mechanism 40 in an opposite direction away from its resting position.

The act of securing the presently preferred wafer carrier 28 to the presently preferred conveyor 26 requires only that the wafer carrier 28 be positioned in a predetermined alignment with respect to the locking mechanism 40. The predetermined alignment is such that the locking mechanism 40 can engage the engagement feature on the wafer carrier 28. Relatively few acts are required to couple the wafer carrier 28 to the conveyor 26 since the locking mechanism 40 is rotated in a single motion to the locked state without further manipulation of the wafer carrier 28. In addition, since the locked state is the resting position of the locking mechanism 40, loss of power or pneumatic air supply will not cause the wafer carrier 28 to detach from the conveyor 26. Further, the locking mechanism 40 is advantageously designed to withstand significant thrust loads that can be created as the wafer carrier 28 is positioned concentric therewith. The locking mechanism 40 is also tolerant to variations in the alignment of the wafer carrier 28 with the locking mechanism 40 as is hereinafter described.

Figure 3:
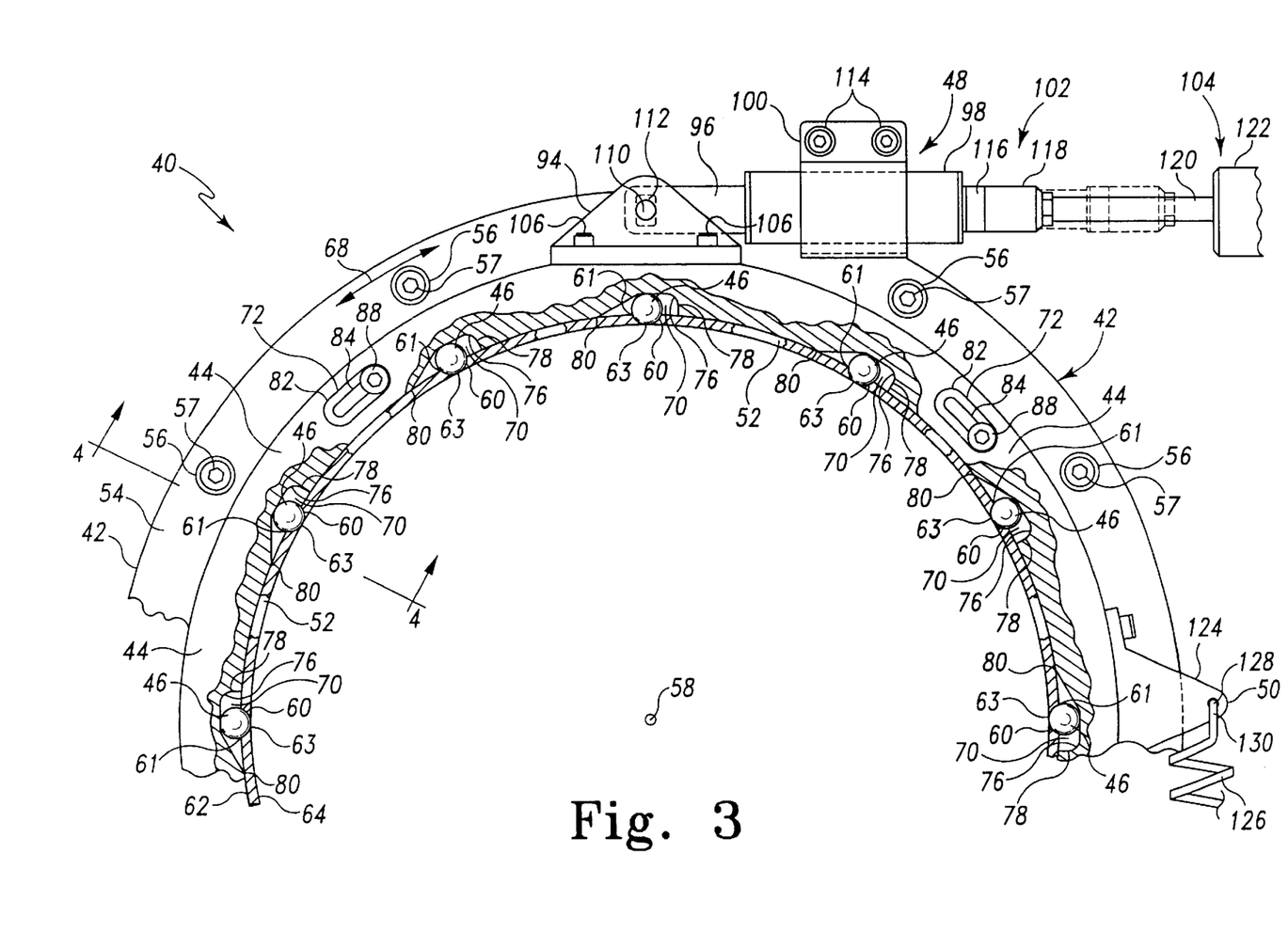
FIG. 3 is a partial sectional view of a portion of the presently preferred locking mechanism illustrated in FIG. 2.

FIG. 3 is a schematic of a portion of the presently preferred locking mechanism 40 with portions removed for illustrative purposes. The locking mechanism 40 includes a retention ring 42, a cam ring 44, a plurality of locking elements 46, an actuator assembly 48 and a retention assembly 50. The presently preferred locking mechanism 40 is adapted to be coupled with the conveyor 26 and the wafer carrier 28 as hereinafter described.

The presently preferred retention ring 42 includes a wall 52, a base 54 and a plurality of mounting bores 56. The retention ring 42 concentrically surrounds a central axis 58 of the locking mechanism 40 and can be formed of metal or similar rigid material. The wall 52 defines a cylindrically hollow tube that extends concentric with the central axis 58 a predetermined distance from the base 54. Disposed in the wall 52 are a plurality of apertures 60.

Figure 4:
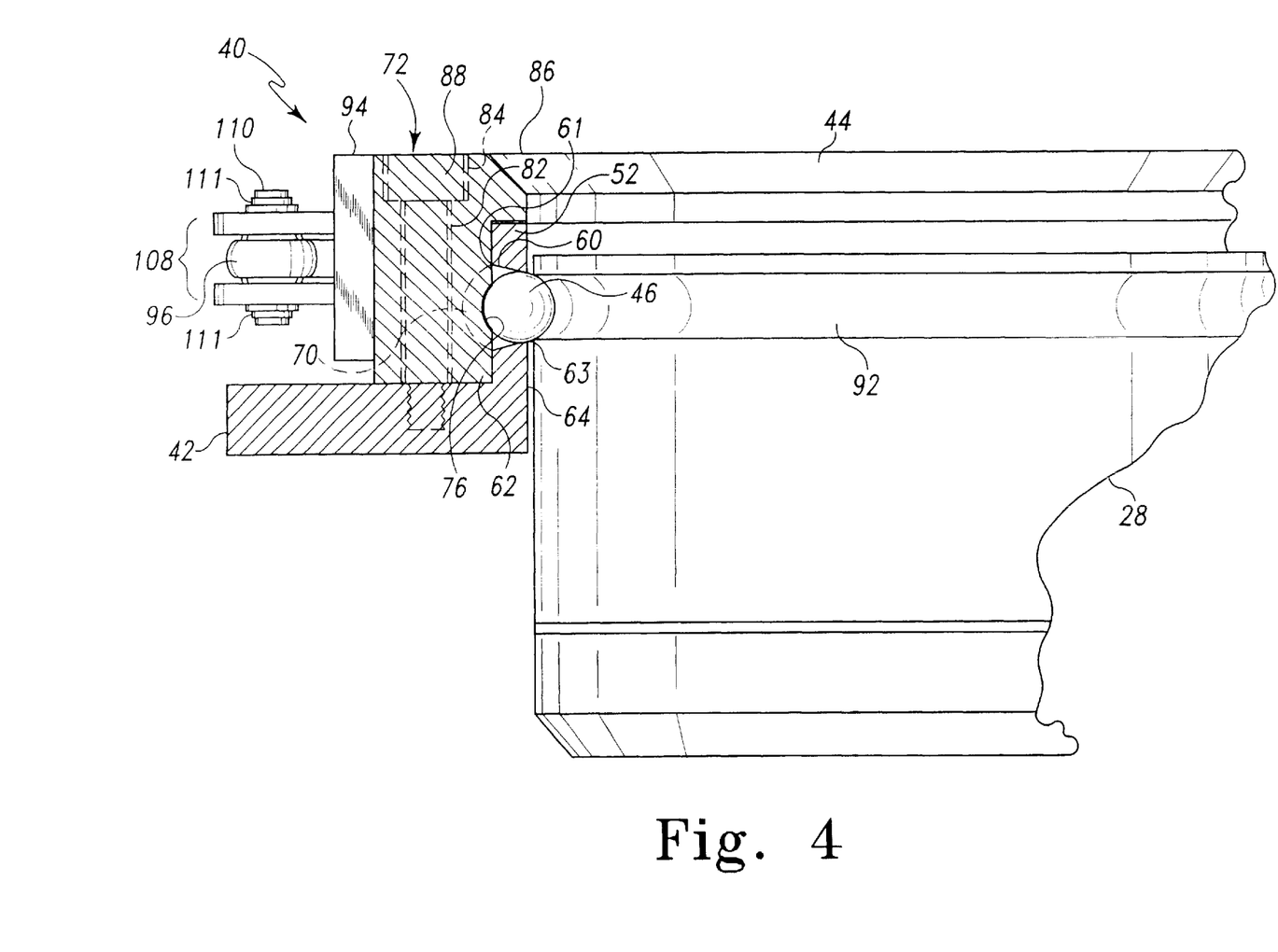
FIG. 4 is a cross-sectional view taken along lines 4—4 of presently preferred locking mechanism illustrated in FIG. 3 that includes the presently preferred wafer carrier not illustrated in cross-section.

FIG. 4 is cross-sectional view of the presently preferred locking mechanism 40 that includes an elevational view of a portion of the wafer carrier 28. As illustrated in FIGS. 3 and 4, the apertures 60 have a first diameter 61 on an outer surface 62 of the wall 52 and a second diameter 63 on an inner surface 64 of the wall 52. The first and second diameters 61, 63 form a conically shaped aperture that extends through the retention ring 42 as best illustrated in FIG. 4. The first diameter 61 is larger than the second diameter 63 such that the apertures 60 taper inwardly as they extend through the wall 52. The first diameter 61 is sized to accept the locking elements 46 therein. The second diameter 63 is sized to allow a portion of the locking elements 46 to protrude from the apertures 60 past the inner surface 64 of the retention ring 42 without passing completely through the apertures 60 as illustrated.

Referring again to FIG. 3, the base 54 is a surrounding lip that radially extends perpendicularly from the wall 52 and is integrally formed therewith. The mounting bores 56 are apertures that extend through the base 54 in a parallel plane with the wall 52. The mounting bores 56 are adapted to accept a fastener 57 that can be, for example, rivets, nuts and bolts or other similar mechanisms. The presently preferred fasteners are threaded bolts that extend through the mounting bores 56 and are rotatably connected with threaded bores in the conveyor 26. The base 54 is adapted to be fixedly coupled with the conveyor 26. However, in other embodiments, the base 54 can be adapted to be fixedly coupled with any structure where the locking mechanism 40 can be advantageously utilized.

The presently preferred cam ring 44 includes a plurality of cam slots 70 and a plurality of shoulder bolt slots 72. The generally circular cam ring 44 can be formed of steel or other similar rigid material and is slidably coupled with the retention ring 42. The cam ring 44 is positioned concentric with retention ring 42 and is rotatable with respect thereto as illustrated by arrow 68. The presently preferred cam ring 44 is positioned to circumferentially surround the outer surface 62 of the retention ring 42. Disposed in the cam ring 44 are the cam slots 70.

The cam slots 70 are formed in a portion of the surface of the cam ring 44 that is adjacent to the apertures 60 in the retention ring 42. The cam slots 70 are cavities that are formed to accept the locking elements 46 and longitudinally extend a predetermined distance in the direction of rotation of the cam ring 44. Each of the cam slots 70 also include an angular inner surface 76 that defines the depth of the cam slots 70 with respect to the adjacently located retention ring 42. The angular inner surface 76 defines a maximum depth at a first end 78 of the cam slots 70 that uniformly decreases toward a second end 80 such that the minimum depth of the cam slots 70 occurs at the second end 80.

Each of the shoulder bolt slots 72 comprise a through bore slot 82 and a counter bore slot 84. The shoulder bolt slots 72 are cavities that longitudinally extend a predetermined distance in the direction of rotation of the cam ring 44. The shoulder bolt slots 72 are uniformly distributed around the cam ring 44. In the presently preferred embodiments, there are four shoulder bolt slots 72.

Referring again to FIG. 4, the through bore slots 82 extend from a top surface 86 of the cam ring 44 to the retention ring 42 as illustrated. The counter bore slots 84 extend from the top surface 86 a predetermined distance into the cam ring 44. The predetermined distance is sufficient to allow the head of a shoulder bolt 88 to be recessed in the cam ring 44. The shoulder bolts 88 extend through the cam ring 44 and are coupled with the retention ring 42 by threaded connection.

Referring again to FIG. 3, the cam ring 44 is capable of rotating with respect to the retention ring 42 a distance that corresponds to the longitudinally extending length of the shoulder bolt slots 72. Rotation of the cam ring 44 in a counter clockwise direction to an unlocked position, as indicated by arrow 68, places the locking mechanism 40 in the unlocked state. Clockwise rotation of the cam ring 44 to a locked position places the locking mechanism 40 in the locked state. The locked and unlocked state of the locking mechanism 40 corresponds to the position of the locking elements 46 with respect to the retention ring 42.

Figure 5:
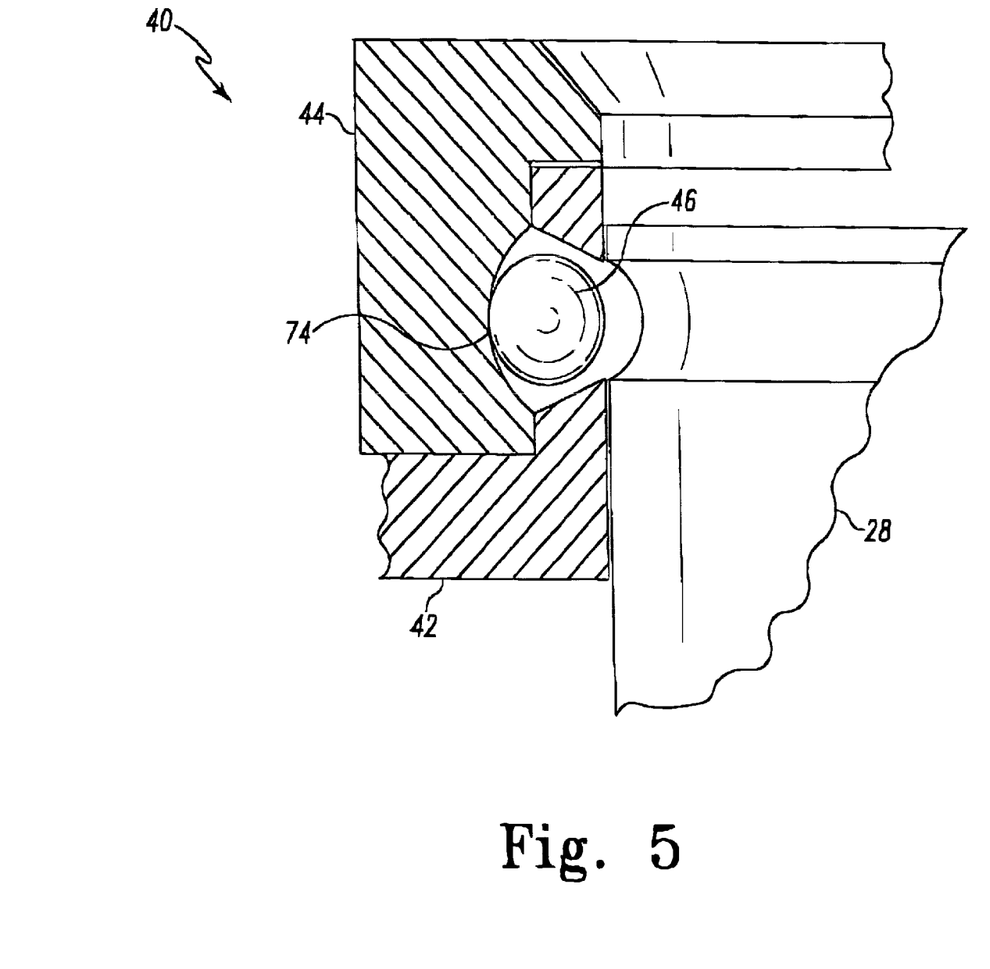
FIG. 5 is a portion of the cross-sectional view of FIG. 4 illustrating the presently preferred locking mechanism in the unlocked state.

The locking elements 46 are formed from any non-compressible material and can be, for example, round, oval, cylindrical, or any other shape capable of being movably positioned within the retention ring 42 and the cam ring 44. The presently preferred locking elements 46 are precision, stainless steel, spherically shaped balls. The locking elements 46 are movably disposed in both the apertures 60 in the retention ring 42 and the cam slots 70 in the cam ring 44. FIG. 5 is a cross-sectional view of a portion of the presently preferred locking mechanism 40 illustrated in FIG. 4 showing the locking mechanism 40 in the unlocked state. When the cam ring 44 is rotated counter clockwise to the unlocked position, the locking elements 46 are in a first position where they do not forcibly contact the presently preferred wafer carrier 28 as illustrated. In the first position, the locking elements 46 protrude in a first direction from the retention ring 42 into the cam slots 70 and are adjacent the angular inner surfaces 76. In other words, the locking elements 46 are positioned near the first end 78 of the cam slots 70 as best illustrated in FIG. 3.

Referring now to FIGS. 3 and 4, as the cam ring 44 is rotated in the clockwise direction to the locked position, the locking mechanism 40 moves to the locked state as illustrated in FIG. 4. As the cam ring 44 is rotated, the angular inner surfaces 76 move the locking elements 46 towards the retention ring 42 by imparting a cam action thereon. The locking elements 46 are moved along the angular inner surfaces 76 to a second position. In the second position, the locking elements 46 protrude the opposite direction from the retention ring 42 and are capable of engaging a groove 92, or other engagement mechanism, on the wafer carrier 28 as best illustrated in FIG. 4. While in the second position, the locking elements 46 still protrude from the retention ring 42 into the cam slots 70 and are held in position by the angular inner surface 76.

In another preferred embodiment, the cam ring 44 is concentrically located within the retention ring 42 adjacent the inner surface 64 thereof. (not illustrated) The locking elements 46 and the cam slots 70 are similarly oriented with respect to the apertures 60 and therefore operate similarly to the previously described embodiments. In this embodiment, the wafer carrier 28 is operable positioned concentric with the retention ring 42 adjacent to the outer surface 62. Accordingly, the locking elements 46 movably engage an engagement mechanism on an inner surface of the wafer carrier 28 when the cam ring 44 is rotated to the locked position.

Referring again to FIG. 3, the presently preferred actuator assembly 48 is illustrated. The actuator assembly 48 includes an attachment bracket 94, a clevis 96, a slider bar 98, a slider bar housing 100, a striker 102 and an actuator 104. The actuator assembly 48 can be formed of metal, plastic or other similar rigid material unless otherwise described herein. The actuator assembly 48 is coupled to the cam ring 44 by the attachment bracket 94 and operates to rotate the cam ring 44.

The presently preferred attachment bracket 94 is fixedly coupled with the cam ring 44 on the exterior surface thereof by fasteners 106. The fasteners 106 of the presently preferred embodiments are bolts rotatably inserted in threaded apertures in the cam ring 44, but could be, for example, welds, rivets or other similar fastening mechanism. Referring now to FIG. 4, the attachment bracket 94 includes a slot 108 that longitudinally extends through the attachment bracket 94 generally parallel with the outer surface of the cam ring 44. A circular dowel 110 is perpendicularly disposed in the slot 108 and is fixedly coupled to the attachment bracket 94 on opposite sides of the slot 108.

The circular dowel 110 is coupled to the attachment bracket 94 by extending through and beyond apertures(not shown) in the attachment bracket 94 such that fasteners 111 can be fixedly coupled to opposite ends of the circular dowel 110. The fasteners 111 can be, for example, snap rings, lock-nuts or other similar mechanisms capable of fixedly holding the circular dowel 110 within the attachment bracket 94. Movably coupled to the circular dowel 110 is the clevis 96. Referring again to FIG. 3, the clevis 96 includes a slot 112 therethrough that longitudinally extends perpendicular to the cam ring 44 and is adapted to circumferentially surround a portion of the circular dowel 110. The slot 112 allows for lateral movement of the clevis 96 during operation of the actuator assembly as described hereinafter. The longitudinally extending clevis 96 is fixedly coupled to the slider bar 98 opposite the slot 112 by, for example, threaded connection, welding or similar coupling mechanism.

The slider bar 98 is a cylindrical shaped structure that longitudinally extends through the slider bar housing 100. The slider bar housing 100 is a cylindrical tubular shaped structure that is adapted to allow slidable movement of the slider bar 98 therethrough. The slider bar housing 100 includes a plurality of apertures 114 to facilitate being fixedly coupled to the conveyor 26 or other housing the locking mechanism 40 is installed upon. The apertures 114 are adapted for insertion of fasteners (not shown) therethrough. The presently preferred fasteners are threaded bolts that are inserted into threaded apertures (not shown) in the conveyor 26, but could be, for example, welds, rivets or similar fastening mechanism. The slider bar housing 100 maintains the axial position of the slider bar 98 with respect to the cam ring 44.

The striker 102 is not coupled to the slider bar 98, but operably contacts and pushes the slider bar 98 to cause the slider bar 98 to slide in a direction away from the striker 102. The striker 102 includes an insert 116 and a head 118. The insert 116 is formed from polyethylene terephthalate (PET), Teflon or other similar material to facilitate non-traumatic contact between the striker 102 and the slider bar 98. The head 118 is rigidly coupled to the insert 116 by threaded connection, adhesive connection or similar connective mechanism. The longitudinally extending head 118 is coupled to the actuator 104 at the end opposite the insert 116. The actuator 104 includes a shaft 120 and a body 122. The shaft 120 longitudinally extends from the body 122 and is coupled with the head 118 by threaded connection. The actuator 104 can be any device capable of imparting a thrusting force on the shaft 120. The presently preferred actuator 104 is a single acting pneumatic actuator.

When the actuator assembly 48 is activated, the actuator 104 is actuated to impart a thrust force on the shaft 120 that cause it to move axially away from the body 122. The striker 102 thereby contacts the slider bar 98 causing the slider bar 98 to slide axially within the slider bar housing 100. The clevis 96 slides axially, and also laterally to the extent of the slot 112, to rotate the cam ring 44. Rotation of the cam ring 44 in the counter clockwise direction to the unlocked position occurs when sufficient thrust force is developed by the actuator assembly 48 to overcome the retention force provided by the retention assembly 50.

The presently preferred retention assembly 50 includes an attachment bracket 124 and a spring 126. The retention assembly 50 can be any assembly that provides the retention force. The retention force is a rotational force in the clockwise direction that is opposite the thrusting force of the actuator assembly 48. The retention assembly 50 maintains a constant retention force on the cam ring 44 to create a positive locking action for the locking mechanism 40. The positive locking action maintains the resting position of the locking mechanism 40 in the locked state Accordingly, when the cam ring 44 is in the unlocked position, the retention force maintains a constant rotational force capable of returning the cam ring 44 to the locked position when the actuator assembly is deactivated.

The presently preferred attachment bracket 124 is fixedly coupled with the cam ring 44 similar to the previously set forth attachment bracket 94 of the actuator assembly 48. The attachment bracket 124 is coupled to the spring 126 by engaging an aperture 128 on the attachment bracket 124 with a first end 130 of the spring 126. Although not illustrated, the spring 126 is similarly coupled with the conveyor 126, or other housing that the locking mechanism 40 is installed upon, at a second end. The presently preferred spring 126 is helical coil that is held in constant tension. The spring 126 could be, for example, a coil spring, a leaf spring or any other mechanism capable of creating the retention force.

In another preferred embodiment, the retention ring 42 is slidable couple and rotatable with respect to the cam ring 44. (not illustrated) In this preferred embodiment, the cam ring 44 is fixedly coupled with the conveyor 26 in similar fashion to the retention ring 42 of the previously described preferred embodiments. In addition, the retention ring 42 is rotatably coupled with the conveyor 26 similar to the cam ring 44 of the previously described preferred embodiments. The actuator assembly 48 and the retention assembly 50 are coupled to the retention ring 42 and control rotation thereof similar to the previously described preferred embodiments.

In another preferred embodiment, the attachment brackets 94, 124 are coupled with the cam ring 44 on an interior surface thereof. (not illustrated) The attachment brackets 94,124 are coupled on the interior surface due to the retention ring 42 surrounding the outer surface of the cam ring 44 as set forth in a previously preferred embodiment. Similarly, in another previously described preferred embodiment where the retention ring 42 is rotatable with respect to the cam ring 44, the attachment brackets 94, 124 are coupled with the inner surface of the retention ring 42. (not illustrated)

In yet another preferred embodiment, the actuator assembly 48 is double acting such that it is capable of imparting the thrusting force in one direction and the retention force in the opposite direction. In this preferred embodiment, the retention assembly 50 is not required. In addition, the striker 102 is fixedly coupled to the slider bar 98 such that operation of the actuator 104 cause rotation between the locked and unlocked states of the locking mechanism 40. The actuator assembly 48 of this preferred embodiment could comprise a motor driven gear, a rotating wheel, a spring loaded actuator or other similar mechanism capable of imparting rotation on the locking mechanism 40 in both the clockwise and counter clockwise directions.

Referring now to FIGS. 2, 3 and 4, the operation of the presently preferred locking mechanism 40 will now be explained. The presently preferred embodiment wherein the cam ring 44 surrounds the retention ring 42 such that the carrier head 28 is concentrically positioned within the retention ring 42 as best illustrated in FIG. 2 will used in the following explanation.

During operation of the wafer polishing system 10, when a wafer carrier 28 is attached to the conveyor 26, the locking mechanism 40 is activated. Prior to the insertion of the wafer carrier 28 into the wafer retainer location 34 in the conveyor 26, the actuator assembly 48 is activated to move the striker 102 to contact the slider bar 98. The slider bar 98 is guided by the slider bar housing 100 to axially slide thereby imparting counter clockwise rotation on the cam ring 44.

The counter clockwise rotation of the cam ring 44 by the actuator assembly 48 moves the cam ring 44 from the locked position to the unlocked position. The degree of rotation of the cam ring 44 is limited to the length of the shoulder bolt slots 72. The counter clockwise rotational thrust force on the cam ring 44 overcomes the opposing clockwise retention force supplied by the retention assembly 50 to rotate the cam ring 44. As the cam ring 44 rotates with respect to the retention ring 42, the angular inner surface 76 of the cam slots 70 are rotated away from the locking elements 46. The locking elements 46 are thereby positioned toward the first end 78 of the cam slots 70 and may retract into the cam slots 70. Retraction of the locking elements 46 into the cam slots 70 may result from the tapered shape of the apertures 60 or the insertion of the wafer carrier 28 within the retention ring 42.

When the wafer carrier 28 is inserted into the wafer retainer location 34 in the conveyor 28, the locking mechanism 40 surrounds the wafer carrier 28. The wafer carrier 28 is aligned in the wafer retainer location 34 such that the groove 92 is adjacent the apertures 60 as best illustrate in FIG. 4. The actuator assembly 48 is de-activated and the retention assembly 50 rotates the cam ring 44 clockwise to the locked position. As the cam ring 44 rotates, the angular inner surfaces 76 of the cam slots 70 are brought into contact with the locking elements 46. The locking elements 46 move along the angular inner surfaces 76 and into the apertures 60 in the retention ring 42 such that a portion of the locking elements 46 protrude from the inner surface 64 thereof. Accordingly, the locking elements 46 engage the groove 92 on the wafer carrier 28 thereby detachedly securing the wafer carrier 28 to the conveyor 26. Slight misalignment of the locking elements 46 and the groove 92 is self-correcting as the locking elements 46 engage the groove 92. In addition, since the groove 92 surrounds the wafer carrier 28, rotational alignment of the wafer carrier 28 with respect to the locking mechanism 40 is unnecessary.

From the foregoing an improved system and method for detachedly securing the wafer carrier 28 to the conveyor 26 has been described. The locking mechanism 40 advantageously provides positive locking action that is capable of withstanding thrust loading and does not require precise alignment. Further, the relatively few acts required to couple and detach the wafer carrier 28 with the conveyor 26 decreases the time required to perform these operations thereby potentially increasing throughput of the wafer polishing system 10.

It is intended that the foregoing detailed description be regarded as illustrative rather than limiting, and that it be understood that the following claims, including all equivalents, are intended to define the scope of this invention.

We claim:

1. A locking mechanism capable of being detachably secured to a housing comprising:

a cam ring comprising a plurality of cam slots each having an angular inner surface;

a plurality of locking elements movably disposed within the cam slots adjacent the angular inner surface;

a retention ring slidably coupled to the cam ring, the retention ring having a plurality of apertures adapted to retain the locking elements within the cam slots, wherein the retention ring is concentric with the cam ring such that the apertures are operatively positioned adjacent the cam slots and the locking elements are operatively movable between a first position wherein a portion of the locking elements only protrude from the retention ring in a first direction and a second position wherein the locking elements also protrude from the retention ring in an opposite direction; and an engagement mechanism on the housing for engagement with the locking elements when the housing is positioned concentrically with respect to the retention ring such that the engagement mechanism is adjacent the apertures.

2. The locking mechanism of claim 1, wherein the cam ring is rotatably operable with respect to the retention ring between an unlocked position and a locked position that correspond to the first and second positions, respectively, of the locking elements.

3. The locking mechanism of claim 2, further comprising an actuator assembly coupled with the cam ring that is operable to movably slide the cam ring between the locked and the unlocked position.

4. The locking mechanism of claim 2, further comprising a retention assembly coupled with the cam ring that is operable to movably slide the cam ring from the unlocked position to the locked position.

5. The locking mechanism of claim 1, wherein the retention ring is rotatably operable with respect to the cam ring between an unlocked position and a locked position that correspond to the first and second positions, respectively, of the locking elements.

6. The locking mechanism of claim 5, further comprising an actuator assembly coupled with the retention ring that is operable to movably slide the retention ring between the locked and the unlocked position.

7. The locking mechanism of claim 5, further comprising a retention assembly coupled with the retention ring that is operable to movably slide the retention ring from the unlocked position to the locked position.

8. The locking mechanism of claim 1, wherein the locking elements are spherically shaped balls.

9. The locking mechanism of claim 1, wherein the engagement mechanism is a groove.

10. The locking mechanism of claim 1, wherein the apertures in the retention ring are conically shaped with a first diameter adjacent the cam ring that is capable of receiving the locking elements and a second diameter smaller than the diameter of the locking elements opposite the cam ring.

11. A locking mechanism for detachably securing a wafer carrier to a conveyor in a chemical mechanical polishing system, wherein the locking mechanism is coupled to the conveyor and comprises:
   a retention ring;
   a plurality of locking elements disposed within the retention ring;
   a cam ring slidably coupled with the retention ring that is concentric therewith and includes a plurality of cam slots, wherein the cam slots include an angular inner surface and are operatively positioned adjacent the locking elements, wherein the locking elements are operably movable between a first position wherein the locking elements are away from the wafer carrier and a second position wherein the locking elements engage the wafer carrier; and
   an engagement mechanism located on the wafer carrier that is adapted to fixedly engage the locking elements when the wafer carrier is operatively disposed concentric with the retention ring and adjacent to the locking elements.

12. The locking mechanism of claim 11, wherein the cam ring is rotatably operable with respect to the retention ring between an unlocked position and a locked position that correspond to the first and second positions, respectively, of the locking elements.

13. The locking mechanism of claim 12, further comprising an actuator assembly coupled with the cam ring that is operable to movably slide the cam ring between the locked and the unlocked position.

14. The locking mechanism of claim 12, further comprising a retention assembly coupled with the cam ring that is operable to movably slide the cam ring from the unlocked position to the locked position.

15. The locking mechanism of claim 12, wherein the retention ring is fixedly coupled with the conveyor.

16. The locking mechanism of claim 11, wherein the retention ring is rotatably operable with respect to the cam ring between an unlocked position and a locked position that correspond to the first and second positions, respectively, of the locking elements.

17. The locking mechanism of claim 16, further comprising an actuator assembly coupled with the retention ring that is operable to movably slide the retention ring between the locked and the unlocked position.

18. The locking mechanism of claim 16, further comprising a retention assembly coupled with the retention ring that is operable to movably slide the retention ring from the unlocked position to the locked position.

19. The locking mechanism of claim 16, wherein the cam ring is fixedly coupled with the conveyor.

20. The locking mechanism of claim 11, wherein the locking elements are spherically shaped balls.

21. The locking mechanism of claim 11, wherein the engagement mechanism is a groove.

22. The locking mechanism of claim 11, wherein the retention ring includes apertures therein that are conically shaped and have a first diameter adjacent the cam ring that is capable of receiving the locking elements and a second diameter that is smaller than the diameter of the locking elements that is opposite the cam ring.

23. A locking mechanism capable of being detachably secured to a housing comprising:
   a cam ring comprising a plurality of cam slots;
   a plurality of locking elements movably disposed within the cam slots; and
   a retention ring slidably coupled to the cam ring, the retention ring operable to retain the locking elements in the cam slots,
   the cam ring rotatable in a first direction with respect to the retention ring to urge the locking elements into engagement with the housing,
   the cam ring rotatable in a second direction with respect to the retention ring to allow the locking elements to disengage from the housing.

24. The locking mechanism of claim 23, further comprising an engagement mechanism disposed on the housing, the engagement mechanism operable to engage with the locking elements.

25. The locking mechanism of claim 24, wherein the cam slots comprise an angular inner sure, the angular inner surface operable to adjust the position of the locking elements with respect to retention ring as the cam ring is rotated.

26. The locking mechanism of claim 25, wherein the retention ring comprises a plurality of apertures, the locking elements operable to protrude through the apertures to engage the housing.

27. The locking mechanism of claim 26, wherein the housing is a wafer carrier.

28. The locking mechanism of claim 26, further comprising an actuator assembly operable to rotate the cam ring with respect to the retention ring.

\* \* \* \* \*

UNITED STATES PATENT AND TRADEMARK OFFICE
CERTIFICATE OF CORRECTION

PATENT NO. : 6,486,550 B1
DATED : November 26, 2002
INVENTOR(S) : Travis

It is certified that error appears in the above-identified patent and that said Letters Patent is hereby corrected as shown below:

Column 12,
Line 52, please delete the number "24" and insert -- 23 --.
Line 53, please delete the word "sure" and insert -- surface --.
Line 57, please delete the number "25" and insert -- 23 --.
Lines 61 and 63, please delete the number "26" and insert -- 23 --.

Signed and Sealed this

Eighth Day of April, 2003

JAMES E. ROGAN
*Director of the United States Patent and Trademark Office*